United States Patent
Bajolle et al.

(10) Patent No.: US 9,082,061 B2
(45) Date of Patent: Jul. 14, 2015

(54) METHOD FOR INTERCONNECTING A CONDUCTIVE PAD AND AN ELECTRICAL CONTACT VIA A SPRING, AND CORRESPONDING DEVICE

(75) Inventors: Antoine Bajolle, Singapore (SG); Frédérick Seban, Cassis (FR); Joseph Leibenguth, Saint-Cloud (FR); François Roussel, Auriol (FR); Jean-Christophe Fidalgo, Gemenos (FR)

(73) Assignee: GEMALTO SA, Meudon (FR)

( * ) Notice: Subject to any disclaimer, the term of this patent is extended or adjusted under 35 U.S.C. 154(b) by 239 days.

(21) Appl. No.: 13/883,511

(22) PCT Filed: Nov. 3, 2011

(86) PCT No.: PCT/EP2011/069365
§ 371 (c)(1),
(2), (4) Date: Jul. 30, 2013

(87) PCT Pub. No.: WO2012/059557
PCT Pub. Date: May 10, 2012

(65) Prior Publication Data
US 2013/0299595 A1    Nov. 14, 2013

(30) Foreign Application Priority Data
Nov. 4, 2010   (EP) .................................... 10306209

(51) Int. Cl.
 G06K 19/00     (2006.01)
 G06K 19/077    (2006.01)
(52) U.S. Cl.
 CPC .... G06K 19/07769 (2013.01); G06K 19/07745 (2013.01); G06K 19/07749 (2013.01); *H01L 2924/0002* (2013.01); *Y10T 29/49155* (2015.01)

(58) Field of Classification Search
 USPC ......................................................... 235/492
 See application file for complete search history.

(56) References Cited

U.S. PATENT DOCUMENTS 5,598,032 A    1/1997   Fidalgo

FOREIGN PATENT DOCUMENTS

DE       197 49 650 A1    5/1999
FR       2 716 281 A1     8/1995

OTHER PUBLICATIONS

International Search Report (PCT/ISA/210) issued on Jan. 23, 2012, by the European Patent Office as the International Searching Authority for International Application No. PCT/EP2011/069365.
Written Opinion (PCT/ISA/237) issued on Jan. 23, 2012, by the European Patent Office as the International Searching Authority for International Application No. PCT/EP2011/069365.

*Primary Examiner* — Daniel Hess
(74) *Attorney, Agent, or Firm* — Buchanan Ingersoll & Rooney PC

(57) ABSTRACT

A device having an integrated-circuit chip includes an insulating body containing at least one conductive pad, at least one electrical contact opposite the electrically conductive pad, and at least one recess in the body, including a bottom and one aperture. The recess is connected, at the bottom thereof, to the conductive pad and, at the aperture thereof, to the electrical contact. At least one coil spring is arranged in the recess and connecting the conductive pad to the electrical contact. The installation of the spring in the recess is facilitated by means of the friction of the central portion of the spring relative to the walls of the recess. The invention also relates to a method for producing an electrical connection between at least one conductive pad arranged in an insulating body and at least one electrical contact arranged opposite the electrically conductive pad.

12 Claims, 2 Drawing Sheets

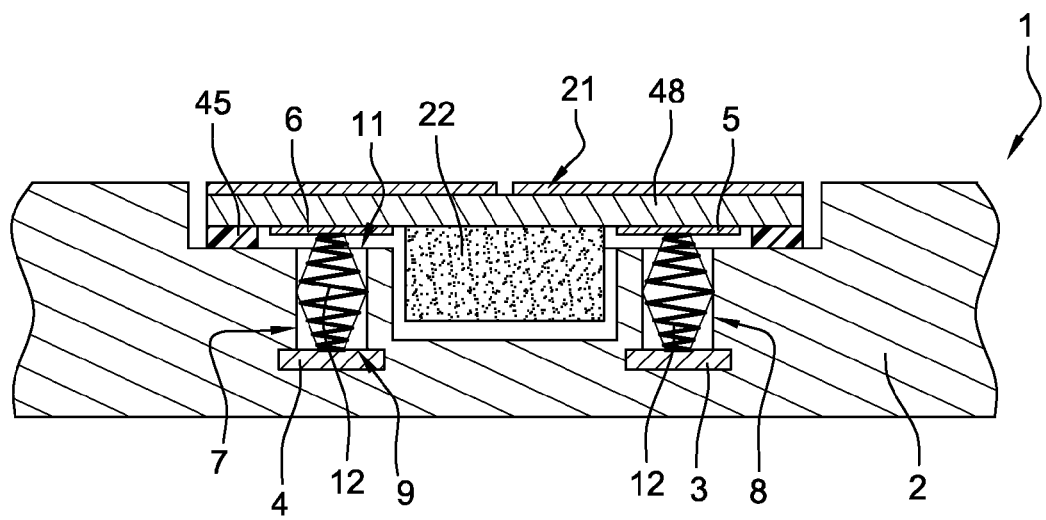
Fig. 1
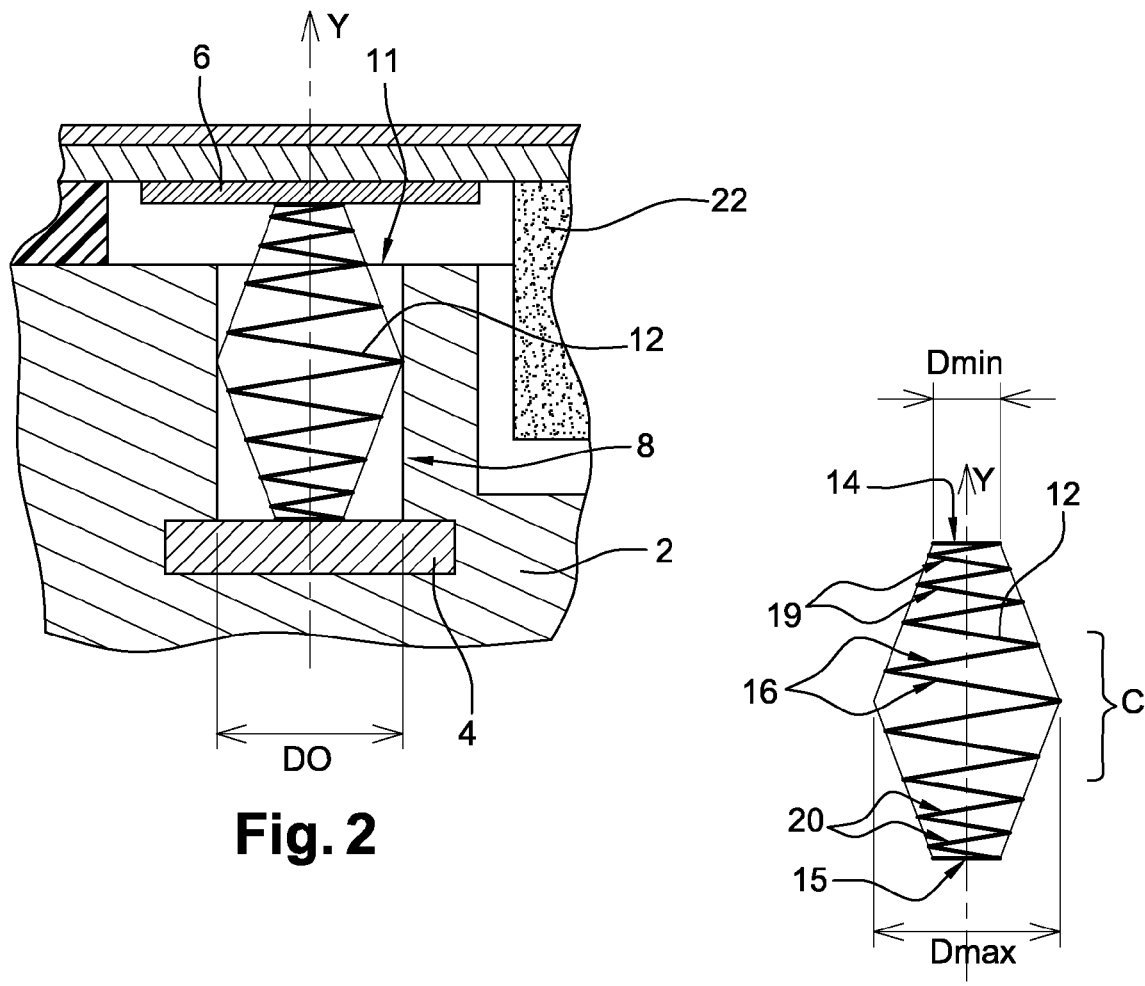
Fig. 2
Fig. 3

METHOD FOR INTERCONNECTING A CONDUCTIVE PAD AND AN ELECTRICAL CONTACT VIA A SPRING, AND CORRESPONDING DEVICE

FIELD OF THE INVENTION

The invention concerns a method for producing an electrical connection between at least one conductive pad disposed in an insulating body and at least one electrical contact disposed opposite said electrically conductive pad.

It relates in particular to hybrid (contact and contactless) chip cards.

The invention aims to solve a problem of durability of connections between a module and an antenna disposed in a card body.

PRIOR ART

Patent Application FR 2716281-A1 describes a method for producing a chip card, comprising a step of connection of a chip-card module or integrated-circuit chip to an antenna contained in a card body. Various interconnection means used comprise in particular conductive materials, spring blades and springs. These elements are disposed in cavities or orifices extending from the surface of the body as far as the conductive pads.

The connections are made with conductive glue that is disposed in the cavities. These connections are not sufficiently durable with respect to more demanding bending and/or torsion tests on the card, in particular in the banking sector. In particular, with conductive glue, there is a time needed for polymerisation of the glue before testing or use.

Moreover, it is not practical or industrial to use springs that would be disposed in the cavities or orifices described above. Fitting a helical spring in at least one housing poses a problem of manipulation, introduction into the housing, positioning and holding of the springs in the cavities as far as the step of transferring, connecting and fixing the chip or module to the card body.

The cards cannot be manipulated at rates and with the jolts imposed by the production machines. The springs are liable to be ejected during the movement of the cards and there may then be scrapping of cards because of absence of a spring in the housing.

In order to avoid the above drawbacks relating to electrical connections of the soldering type or with conductive material, there exist contactless connections, in particular by electromagnetic coupling, which consist of producing a radio-frequency module, comprising a radio-frequency chip connected to an antenna that is embedded in a card body containing a passive antenna.

A radio-frequency communication satisfying in particular ISO 14443 or the NFC standard is obtained with antenna turns extending substantially over the peripheral circumference of the card body. The passive antenna is electromagnetically coupled with the module antenna. However, there may be problems of range of communication, the metal contact pads being liable to form a screen to the radio-frequency signals.

The invention aims to solve the above drawbacks.

In particular, the invention relates to a method for producing a contactless function on a device with an integrated-circuit chip and where applicable also a contact function, which is resistant to torsion/bending stresses and has good radio-frequency performance.

SUMMARY OF THE INVENTION

The invention consists in its principle of holding an electrical connection via springs and keeping them in place in the cavities at least during the transfers of the cards from station to station during production and without compromising their ability to compress and freedom of movement in a cavity; these abilities are essential to the production of an elastic electrical contact of durable quality. Preferably, the springs are frustoconical and pointed at their ends in order to facilitate introduction thereof into a housing.

To this end, the subject matter of the invention is an electronic device with an integrated-circuit chip comprising an insulating body containing at least one conductive pad, at least one electrical contact opposite said electrically conductive pad, at least one housing in the body, comprising a bottom and an aperture, said housing emerging at the bottom of the conductive pad and emerging at its aperture on the electrical contact, at least one helical spring disposed in the housing and connecting the conductive pad to the electrical contact, said spring comprising a central portion (C) between its two ends.

The device is distinguished in that it comprises centring and/or holding means configured to facilitate the placing of the spring in its housing and/or to hold it at least by friction of the central part (C) of the spring with respect to the wall of its housing.

According to the invention, the device also comprises other features in accordance with claims 2 to 9.

The subject matter of the invention is also the method according to claim 10.

DESCRIPTION OF THE FIGURES

FIG. 1 illustrates a contactless chip card (in transverse section through the middle of the chip-card module) according to one embodiment of the invention;

FIG. 2 illustrates an enlargement of the spring in its housing of the previous figure;

FIG. 3 illustrates the spring all alone of the previous figure;

DETAILED DESCRIPTION OF THE EMBODIMENTS

Figure 4:
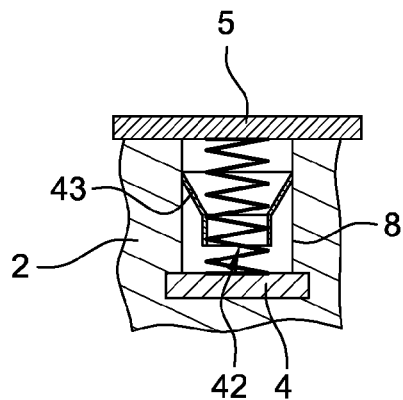
FIG. 4 illustrates a second embodiment of the device connecting a conductive pad with an electrical contact, in which the spring is configured with a centring and/or holding ring.

FIG. 1 shows a device according to one embodiment of the invention. It comprises an insulating body 2 containing at least one conductive pad 3, 4, at least one electrical contact 5, 6 opposite said electrically conductive pad, at least one housing 7, 8 in the body, comprising a bottom 9, 10 and an aperture 11, said housing emerging onto (or accessing), through its bottom, the conductive pad 3, 4 and the electrical contact 5, 6 through its aperture.

The device is here an integrated-circuit chip card 1 of the contactless type. The card 1 comprises a card body 2 made from insulating material, in particular plastics material. The body may be obtained by moulding or cold rolling or hot from several sheets or layers of material with or without adhesives. The electrical contacts and/or the electrically conductive pads are intended to connect an integrated-circuit chip housed in the module.

Where applicable, the electrical contacts 5, 6 are the pads of an integrated-circuit chip or electronic or electrical component such as a battery, a display, biometric sensor or keypad. The conductive pads 3, 4 may be those of any circuit, such as an antenna, capacitor, electrical or electronic component, or pads connected to redirection tracks.

The device may be any other device, in particular an electronic passport, provided that electrical contacts under a main surface of a body are to be connected with other contacts through a cavity or orifice.

The conductive pads represent here the terminal portions of a radio-frequency antenna, in particular wound according to ISO 14443, NFC or of the UHF type. The antenna is connected to the two conductive surfaces of the module 21 via the springs 12 and the module comprises an integrated-circuit chip connected to the electrical contacts 5, 6. The module may comprise contact pads 46 on the surface carried by a dielectric support 48, in order to communicate electrically with a terminal with electrical connector.

The device comprises at least one helical spring (a compression spring with non-contiguous turns) 12, 13 disposed in the housing 7, 8 and connecting the conductive pad 3, 4 to the electrical contact 5, 6.

In FIGS. 1 to 3, the spring comprises a central portion C disposed between its two ends 14, 15, end turns 19, 20 of the spring have a degree of freedom along a longitudinal axis Y of the spring to make it possible to compress the spring and provide an elastic electrical-contact force against the contacts to be interconnected.

According to one feature of the invention, the device comprises means 8, 16 configured to facilitate the placing of the spring and/or to hold at least by friction the central part C of the spring in the cavity.

According to one embodiment, the cross-section Dmin of an end 14, 15 of the spring is less than that D0 of the aperture of the housing 7. This facilitates the introduction of the spring into the orifice for receiving the spring or aperture 11 of the housing 7.

In the example in FIG. 3, the spring comprises two portions comprising turns the cross-section of which perpendicular to the axis Y decreases from the central part C towards its two ends. The central portion of the spring may comprise one to three turns 16 larger with respect to the others. The central turns 16 have a cross-section or a diameter Dmax greater than the cross-section or diameter Dmin of the ends 14, 15 of the spring.

Concerning the chip card, for example, the springs have a length of 0.3 to 0.5 mm at rest, the maximum diameter of the spring (Dmax) is between approximately 0.5 and 1 mm and a minimum diameter (Dmin) is between 0.4 and 0.8 mm. Preferably Dmin is 10% to 50% less compared with Dmax.

The central portion of the spring cooperates with the housing in order to hold the spring in the housing at least by friction with the wall of the housing. The central section is substantially equal or slightly greater in order to compress the central turns radially in the housing (perpendicular to the axis Y).

Thus, once the spring is introduced into its housing, it no longer escapes during the various manipulations of the body 2 before making the interconnection with the electrical contacts 5, 6, in this case by embedding the module 21 in the card body in order to contain the springs definitively.

Alternatively, the forms relating to the housing and spring may be reversed so as to preserve the freedom of movement of the turns at the ends. The spring may then be cylindrical while the housing may have a cross-section at the bottom and at the aperture greater than the diameter of the spring.

According to another embodiment in FIG. 4, the housing 7 may comprise a cross-section that broadens in the direction of the bottom and/or its recess from a central section of the spring or housing.

According to another embodiment, the device may comprise a holding or centring element disposed around the spring and between the spring and the wall of the housing and substantially level with the central part.

The element in question may consist of a ring or skirt 43 which, where applicable, may be frustoconical, in order to facilitate the introduction of the spring therein and to facilitate the insertion of the assembly in the aperture 11 of the housing 8. The housing is in this case cylindrical with a cross-section larger than that of the spring. The skirt is deformable when it is introduced into the housing.

Figure 5:
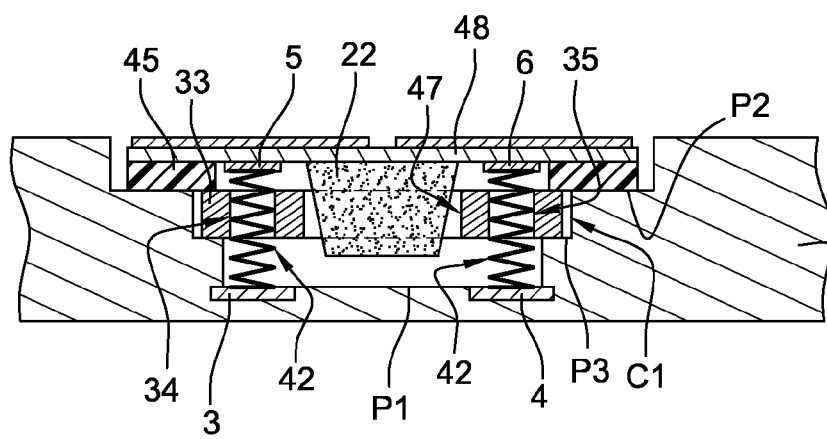
FIG. 5 illustrates a third embodiment of the device for connecting a pad with an electrical contact, in which the springs are configured with a centring and/or holding plate.

According to another embodiment in FIG. 5, the holding or centring element 33 is a plate that receives at least two springs. It is intended to be disposed between the plane of the electrical contacts 5 and that of the conductive pads 4.

The holding or centring element may comprise a central orifice 47 so as to house therein all or part of a component and/or its enrobing. It may comprise a surface corresponding substantially to that of the cavity C1. Cylindrical springs or ones such as those in FIG. 1 may be fixed first to a sheet 33 or support plate. The sheet or plate may comprise two orifices 34, 35 for receiving the springs and a central orifice corresponding to the enrobing 22 of the module. The sheet is then placed in the cavity level with an intermediate plane P3 between the conductive pads and electrical contacts.

The module is stuck in the cavity C1 with a hot-melt film 45. The module may or may not comprise contact pads 46 on the surface. The orifices 35 in the plate may be conical in order to facilitate the introduction of the springs.

Alternatively, the springs are those in FIG. 3. The advantage of this element is to effect a machining of the cavities more rapidly and to place the two springs in the cavity at the same time in a single operation since they are pre-assembled via a centring plate.

A description will now be given, in relation to FIGS. 1, 4, 5 and 6, of the method of the invention for producing an electrical connection between at least one conductive pad disposed in an insulating body and at least one electrical contact disposed opposite said electrically conductive pad.

The method comprises the steps of creation, in the body 2, of a housing comprising a bottom and a recess. The housing is intended to afford access to the outside of the conductive pad through the aperture of the housing.

The method comprises the placing of at least one helical spring 12, 42 in at least one housing 8, 35. The spring comprises a central portion (C) between its two ends, end turns 19, 20 of the spring having a degree of freedom along the longitudinal axis (Y) in order to compress the spring.

Next the conductive pad 4 is transferred and connected to the electrical contact 5.

Finally, the method according to the invention comprises a step of configuring the springs and/or the housings in order to facilitate the introduction of the spring and to firmly position the central part of the spring in the cavity. This step is implemented with different centring means illustrated below in the figures.

The method described in FIG. 1 has the advantage of not changing the current method for manufacturing hybrid cards with the exception of a particular configuration of the spring with respect to their housing. The form of the spring comprises a doubly frustoconical form, the base of the two truncated cones being level with the central part.

The conical or pointed part of the spring facilitates its introduction and placing in its housing. The electrical contact is concentrated on a smaller surface at the end of the spring for better contact.

The spring is symmetrical while having a conical portion at the two ends that facilitates its manipulation and avoids errors in orientation when it is gripped by automatic machines for transferring the springs into their housing.

In FIG. 4, the current operating method for manufacturing a hybrid card is not changed but the housings are broadened a little more than the springs and a centring and/or holding element 43 is used between the spring and the wall of the spring housing. The spring is here configured with its centring ring or skirt. The housing is configured (broadened) to the diameter of the ring or at least slightly less (for example 1% to 10%) for gentle clamping.

In FIG. 5, for housing the spring centring sheet or plate 33, a cavity (C1) is produced with a plane P3. The springs 42 are configured with the plate and the latter cooperates with the wall of the cavity (C1) in order to position the springs with respect to the contacts and pads to be interconnected. A single cavity is obtained with several stages P1, P2, P3 configured so as to receive at least the plate supporting the springs.

Figure 6:
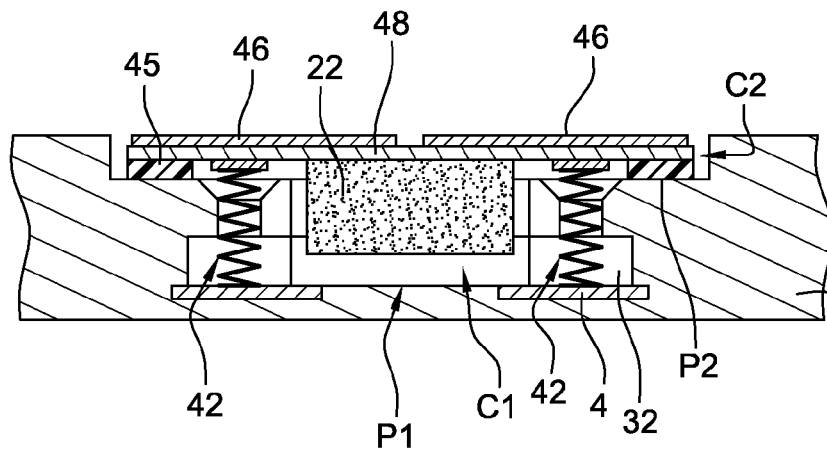
FIG. 6 illustrates a fourth embodiment of the device for connecting a conductive pad with an electrical contact, in which the housing itself is configured to centre and/or hold the spring.
Figure 7:
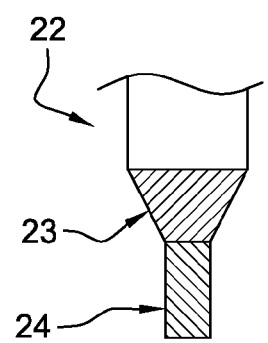
FIG. 7 illustrates a milling cutter suitable for producing portions of the housings in the previous figure, in particular the bottom.
Figure 8:
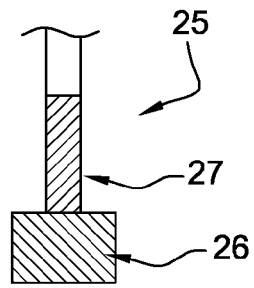
FIG. 8 illustrates a milling cutter suitable for producing a portion of the housings in FIG. 7, in particular the central wall and the aperture.

In FIG. 6, the spring has the advantage of being standard and cylindrical and the housing of the spring is configured so that it comprises a broadened part at the bottom and at the aperture. To produce the cavity, successive operating steps are implemented by means of the specific milling cutters illustrated in FIGS. 7, 8.

Thus, for example, a milling cutter 22 (FIG. 7) is used that has a portion of revolution 23 splayed in the direction of its gripping axis in order to form a step or clearance around the top turns of the spring adjacent to the module. It also comprises a straight portion of revolution 24 substantially less than or equal to the diameter of the spring in order to form at least the central portion C of the spring.

Another milling cutter (FIG. 8) is also used, which comprises an end portion of revolution 26 wider than the cross-section of a cylindrical spring and a straight portion 27 having a cross-section slightly less than that of the spring (for example less by 10%).

In operation, the planes P1 and P2 are first of all produced, corresponding respectively to the bottom of the cavity and the bonding plane of the module. The plane P1 is substantially level with the conductive pads 3, 4. Next, the milling cutter 25 is brought level with the conductive pads, and then is moved laterally until the axis of the milling cutter coincides with that of the spring housings in order to form a kind of lug (recess 32 in plan view) at the cavity.

Next, the milling cutter 22 is used above the axis of the housings towards the bottom of the cavity (C1) as far as the level of the conductive pads in order to form both a central portion of the housing and a splayed (conical) aperture of the housing. Thus the spring, of standard shape, can easily be introduced into the aperture. In addition, it is held in place by its central portion, which corresponds substantially to the cross-section of the central portion of the housing. A cavity is obtained that communicates with the housings of the springs.

There is no risk of the spring escaping laterally in the direction of the cavity of the chip through the recess resulting from the machining of the portion 27 of the milling cutter 25 since the diameter obtained is less than that of the spring.

The invention also provides conductive means for improving the electrical contact of the spring with the elements to be connected electrically. The spring may comprise a solder at at least one of its ends in order to solder the conductive pad and/or the electrical contact. The soldering may be effected hot, in particular with tin/lead, or cold with a conductive material or adhesive, optionally with UV polymerisation and retarder or not.

For hot soldering, the invention may make provision for tinning each end contact to which the soldering relates and/or where applicable also the conductive pad and/or electrical contact concerned.

Each spring is placed in its housing and the soldering/brazing of the spring to the conductive pad is obtained by the addition of energy directly to the spring or of the solder in particular by a laser beam.

The soldering/brazing with the electrical contact may be obtained by heating the contact from outside. Where it is a case of a chip-card module, the brazing may be done by heating the module during a phase of hot-melt embedding and hot pressing of the module.

Where applicable, the ends of the spring comprise an anti-corrosion coating that is a good conductor, such as for example gold or nickel/gold.

The invention claimed is:

1. A device with an integrated-circuit chip comprising:
   an insulating body containing at least one conductive pad,
   at least one electrical contact opposite said electrically conductive pad,
   at least one housing in the body, comprising a bottom and a wall forming an aperture, said housing bottom being located at the conductive pad and the aperture being located at the electrical contact,
   at least one helical spring disposed in the housing and connecting the conductive pad to the electrical contact, said spring comprising a central portion between its two ends, and
   wherein said housing and said spring are configured so as to hold the spring in the housing by friction of the central part of the spring with respect to the wall of the housing.

2. A device according to claim 1, wherein the cross-section of an end of the spring is less than that of the aperture of the housing.

3. A device according to claim 1, wherein the spring comprises two frustoconical portions opposed through their base, which is situated level with a central portion of the spring.

4. A device according to claim 3, wherein the housing comprises a transverse section that broadens in the direction of the bottom and in the direction of its aperture from a central section.

5. A device according to claim 1, wherein the spring comprises two portions comprising turns, the cross-section of which decreases from the central part in the direction of its two ends.

6. A device according to claim 1, further comprising a holding or centering element disposed around the spring and between the spring and the wall of the housing and substantially level with the central portion.

7. A device according to claim 6, wherein the holding or centering element receives at least two springs.

8. A device according to claim 1, wherein the holding or centering element comprises an orifice so as to house therein all or part of a component and/or its enrobing.

9. A device according to claim 1, wherein the spring comprises soldering at least at one of its ends in order to solder the conductive pad and/or the electrical contact.

10. An electronic device according to claim 1, further comprising a radio-frequency antenna connected to the two conductive pads and an integrated-circuit chip connected to the electrical contacts.

11. An electronic device according to claim 1, wherein the device comprises a chip card or electronic passport.

12. A method for producing an electrical connection between at least one conductive pad disposed in an insulating body and at least one electrical contact of an integrated circuit disposed opposite said conductive pad, said method comprising the steps of creating, in the body, a housing comprising a bottom and an aperture, said housing having a wall with a bottom at the conductive pad and the electrical contact at its aperture, fitting at least one helical spring in at least one housing, said spring comprising a central portion between two ends, transferring and connection of the conductive pad to the electrical contact, and configuring the spring and the housing to hold the spring in the housing by friction of the central part of the spring with respect to the wall of the housing.

* * * * *